US012604599B2

(12) United States Patent
Zhang

(10) Patent No.: US 12,604,599 B2
(45) Date of Patent: Apr. 14, 2026

(54) DISPLAY PANEL WITH IMPROVED CHARGE GENERATION LAYER

(71) Applicant: SHENZHEN CHINA STAR OPTOELECTRONICS SEMICONDUCTOR DISPLAY TECHNOLOGY CO., LTD., Shenzhen (CN)

(72) Inventor: Shuren Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 706 days.

(21) Appl. No.: 18/050,832

(22) Filed: Oct. 28, 2022

(65) Prior Publication Data

US 2024/0107787 A1      Mar. 28, 2024

(30) Foreign Application Priority Data

Sep. 28, 2022    (CN) .......................... 202211193046.0

(51) Int. Cl.
*H10K 50/11*          (2023.01)
*H10K 71/00*          (2023.01)
*H10K 101/40*         (2023.01)

(52) U.S. Cl.
CPC .............. *H10K 50/11* (2023.02); *H10K 71/00* (2023.02); *H10K 2101/40* (2023.02)

(58) Field of Classification Search
CPC ..................................................... H10K 50/11
(Continued)

(56) References Cited

U.S. PATENT DOCUMENTS

2014/0023963 A1*   1/2014   Zhou ..................... G03G 5/0609
                                                                430/58.65
2015/0249214 A1*   9/2015   Watanabe .............. B82Y 10/00
                                                                526/240

FOREIGN PATENT DOCUMENTS

CN            1663060 A       8/2005
CN       102074658 A   *   5/2011
            (Continued)

OTHER PUBLICATIONS

Chinese Office Action issued in corresponding Chinese Patent Application No. 202211193046.0 dated Jul. 13, 2024, pp. 1-6.

*Primary Examiner* — Ajay Arora
(74) *Attorney, Agent, or Firm* — PV IP PC; Peter Stecher; Wei Te Chung

(57) ABSTRACT

The present invention relates to a display panel and a manufacturing method of the display panel. A charge generation layer of the present invention is produced using a mixture of an n-type organic material, a p-type organic material, and a polar solvent. The n-type organic material and the p-type organic material are mixed to form the charge generation layer, so that a contact area between the n-type organic material and the p-type organic material is increased. Accordingly, the present invention improves the transfer efficiency of charges, improves chances of separation of electrons and holes, and finally improves the charge generation efficiency of the charge generation layer. Therefore, the present invention avoids the use of a fine metal mask (FMM) in an evaporation process. Consequently, the present application reduces production costs and can be used in large-size-screen G8.6 production lines.

8 Claims, 2 Drawing Sheets

(58) Field of Classification Search
USPC ........................................................... 257/40
See application file for complete search history.

(56)                    References Cited

FOREIGN PATENT DOCUMENTS

| CN | 102738399 | A |   | 10/2012 |  |
|----|-----------|---|---|---------|--|
| CN | 108346748 | A | * | 7/2018  | ............. H10K 71/00 |

* cited by examiner

100

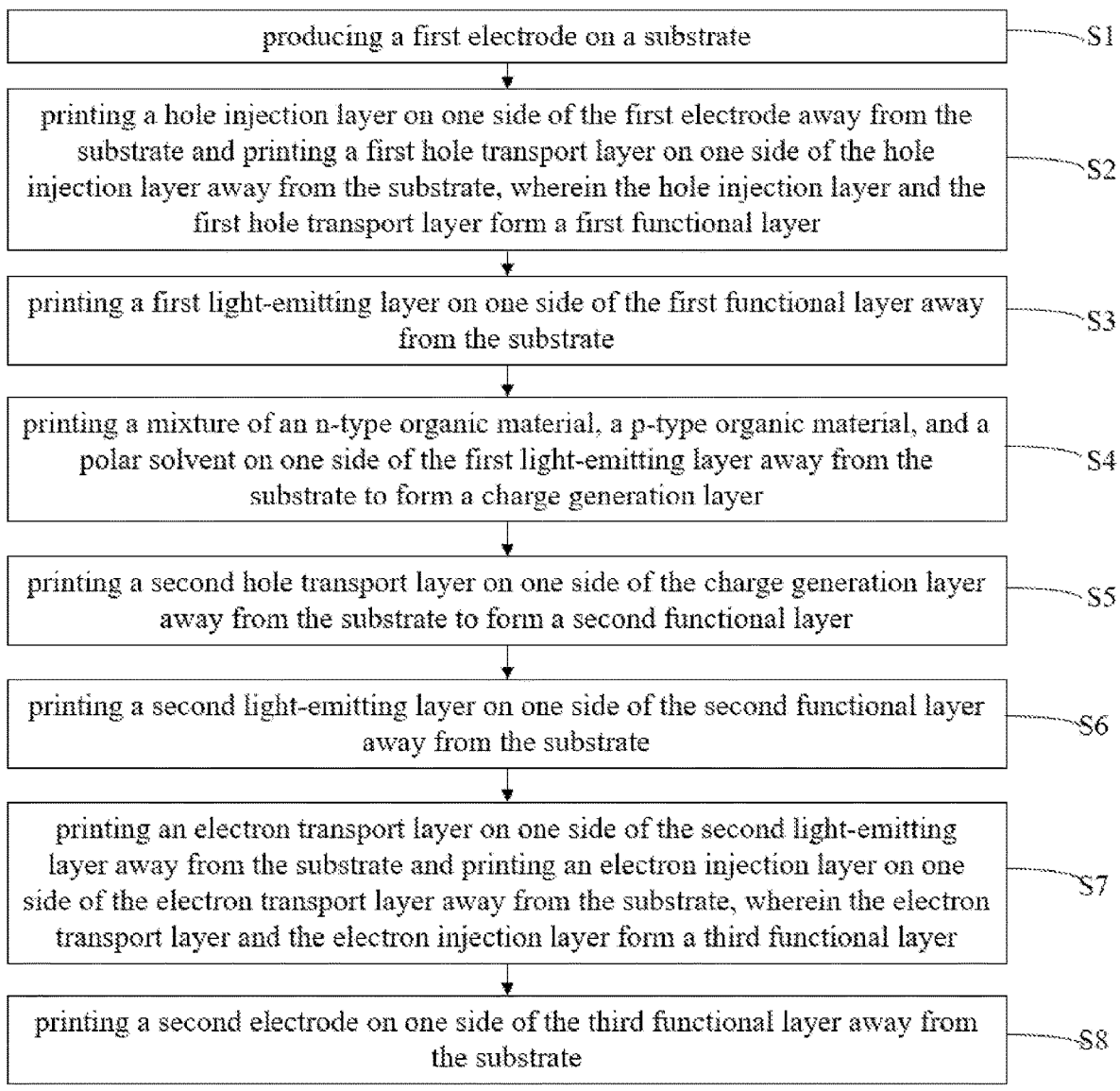

| producing a first electrode on a substrate | S1 |

| printing a hole injection layer on one side of the first electrode away from the substrate and printing a first hole transport layer on one side of the hole injection layer away from the substrate, wherein the hole injection layer and the first hole transport layer form a first functional layer | S2 |

| printing a first light-emitting layer on one side of the first functional layer away from the substrate | S3 |

| printing a mixture of an n-type organic material, a p-type organic material, and a polar solvent on one side of the first light-emitting layer away from the substrate to form a charge generation layer | S4 |

| printing a second hole transport layer on one side of the charge generation layer away from the substrate to form a second functional layer | S5 |

| printing a second light-emitting layer on one side of the second functional layer away from the substrate | S6 |

| printing an electron transport layer on one side of the second light-emitting layer away from the substrate and printing an electron injection layer on one side of the electron transport layer away from the substrate, wherein the electron transport layer and the electron injection layer form a third functional layer | S7 |

| printing a second electrode on one side of the third functional layer away from the substrate | S8 |

FIG. 2

DISPLAY PANEL WITH IMPROVED CHARGE GENERATION LAYER

FIELD OF DISCLOSURE

The present application relates to a field of display technology and in particular, to a display panel and a manufacturing method thereof.

DESCRIPTION OF RELATED ART

Organic light-emitting diode (OLED for short) is an optoelectronic technology that uses organic semiconductor materials to produce reversible color changes driven by electric current to achieve colorful display. OLED display panels have the advantages such as thinness, high brightness, active light emission, low energy consumption, wide viewing angles, fast response, flexibility, a wide operating temperature range, low voltages, high power saving efficiency, quick response, simple structures, low costs, almost infinite high contrast ratio, so the OLED display panels are considered to be the most promising new generation display technology.

At present, high temperatures can easily damage vehicle displays, so the vehicle displays have higher standards for lifespans of the display panels under high temperatures. Display panels with multiple light-emitting layers stacked on each other have higher efficiency than the single-layered display panels and can reduce current densities at the same brightness, thereby prolonging the lifespans of the display panels. Therefore, industries usually adopt the multilayer display panels to meet the needs of vehicles for long lifespans at high temperatures. The multilayer display panel needs to connect light-emitting layers of the same color through a charge generation layer (CGL for short), so that light rays of the same color are mixed to improve the monochromatic light emission efficiency. The current charge generation layer is generally a double-layer structure formed of an n-type charge generation layer and a p-type charge generation layer located above the n-type charge generation layer. Under an electric field, the n-type charge generation layer generates electrons and injects them into the light-emitting layer below the n-type charge generation layer, and the p-type charge generation layer generates holes and injects them into the light-emitting layer above it, thereby greatly improving luminous efficiency of the display panel. Since a charge transfer occurs only at an interface between the n-type charge generation layer and the p-type charge generation layer, the charge generation efficiency of the charge generation layers is low.

During printing the multilayer display panel, orthogonal solvents are required to prevent a previous layer from being damaged during film deposition. A material of the light-emitting layer generally uses a non-polar solvent, so a material of the n-type charge generation layer above the light-emitting layer needs to use a polar solvent in order to prevent damaging the light-emitting layer, and a material of the p-type charge generation layer needs to use a non-polar solvent in order to prevent damaging the n-type charge generation layer. However, a material of the hole transport layer above the p-type charge generation layer is also made of a non-polar solvent, which will damage the p-type charge generation layer, and as a result, the n-type charge generation layer and the p-type charge generation layer cannot be produced by printing. Accordingly, currently, the n-type charge generation layer and the p-type charge generation layer are usually produced using evaporation processes. This method is effectively used for producing the multilayer display panel by evaporation deposition, but cannot be used for printing the multilayer display panel. Patterning RGB pixels in the evaporation process requires the use of a fine metal mask (FMM for short). Therefore, currently, the largest size of the displays can only be G6 (the size of displays in production lines) because the costs of the FMM is relatively high, and because the FMM sags due to gravity.

SUMMARY

It is an objective of the present invention to provide a display panel and a manufacturing method of the display panel, which can solve problems in conventional techniques including low charge generation efficiency of a charge generation layer, high costs of producing the charge generation layer by using an evaporation process, and inability to be used in large-size-screen production lines.

Accordingly, the present application provides a display panel, comprising:

a substrate;

a first electrode disposed on the substrate;

a charge generation layer disposed at one side of the first electrode away from the substrate; and a second electrode disposed at one side of the charge generation layer away from the substrate;

wherein a material of the charge generation layer comprises a mixture of an n-type organic material, a p-type organic material, and a polar solvent.

In one embodiment, an energy level difference between a highest occupied molecular orbital (HOMO) energy level of the p-type organic material and a lowest unoccupied molecular orbital (LUMO) energy level of the n-type organic material is less than 2 eV.

In one embodiment, the HOMO energy level of the p-type organic material ranges from 4.5 eV to 5.5 eV.

In one embodiment, the LUMO energy level of the n-type organic material ranges from 2 eV to 4 eV.

In one embodiment, a mass ratio of the n-type organic material to the p-type organic material is 1:0.1 to 1:9.

In one embodiment, the n-type organic material is a metal chelate compound, the p-type organic material is a triarylamine-based derivative, and the polar solvent comprises an aromatic-alcohol-based derivative.

In one embodiment, the metal chelate compound comprises: one or more than one of 8-hydroxyquinolate aluminum, a derivative of 8-hydroxyquinolate aluminum, 8-hydroxyquinolate lithium, or a derivative of 8-hydroxyquinolate lithium.

In one embodiment, a thickness of the charge generation layer ranges from 10 nm to 60 nm.

In one embodiment, the display panel further comprises:

a first functional layer disposed between the first electrode and the charge generation layer;

a first light-emitting layer disposed between the first functional layer and the charge generation layer;

a second functional layer disposed between the charge generation layer and the second electrode;

a second light-emitting layer disposed between the second functional layer and the second electrode; and a third functional layer disposed between the second light-emitting layer and the second electrode.

The present application further provides a manufacturing method of a display panel, comprising following steps:

producing a first electrode on a substrate;

printing a mixture of an n-type organic material, a p-type organic material, and a polar solvent at one side of the first electrode away from the substrate to form a charge generation layer; and producing a second electrode at one side of the charge generation layer away from the substrate.

The advantages of the present application:

The present application uses the mixture of the n-type organic material, the p-type organic material, and the polar solvent to produce the charge generation layer. The n-type organic material and the p-type organic material are mixed to form the charge generation layer, so a contact area between the n-type organic material and the p-type organic material is increased, thereby improving transfer efficiency of charges, increasing chances of separation of electrons and holes, and ultimately improving charge generation efficiency of the charge generation layer.

By printing the mixture of the n-type organic material, the p-type organic material, and the polar solvent at one side of the first electrode away from the substrate to form the charge generation layer, the present application avoids the use of a fine metal mask (FMM) in an evaporation process and reduces production costs, and the present application is suitable for being used in large-size-screen G8.6 production lines.

BRIEF DESCRIPTION OF DRAWINGS

In order to more clearly illustrate the embodiments of the present application, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

FIG. 2 is a process flow diagram illustrating manufacturing steps of the display panel of the present application.

DETAILED DESCRIPTION OF EMBODIMENTS

Figure 1:
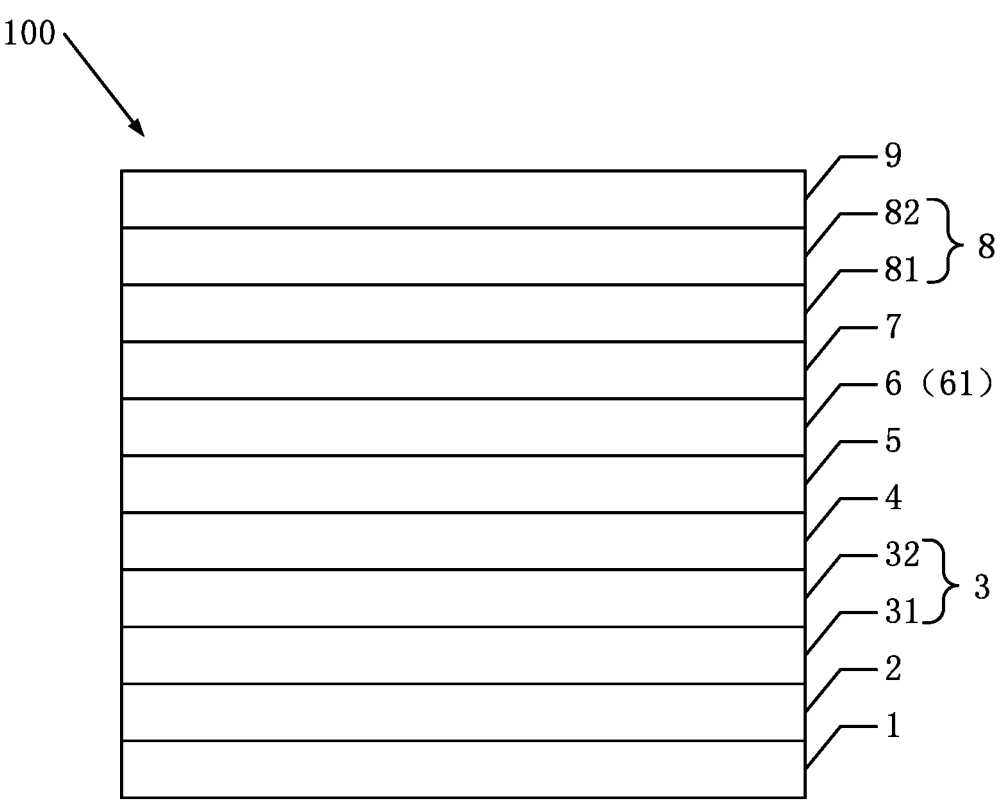
FIG. 1 is a schematic structural view of a display panel of the present invention.

The present invention will be described in detail below in conjunction with the preferable embodiments and with reference to the accompanying drawings, so as to fully introduce the technical content of the present invention to those skilled in the art, exemplify the implementation of the present invention, make the technical content disclosed in the present invention clearer, and make those skilled in the art more readily understand how to implement the present invention. However, the present invention can be embodied in many different embodiments, the protection scope of the present invention is not limited to the embodiments mentioned herein, and the description of the following embodiments is not intended to limit the protection scope of the present invention.

The directional terms mentioned in the present invention, such as "up", "down", "front", "rear", "left", "right", "inside", "outside", and "side", are only directions in the drawings. The directional terms used herein are used to explain and describe the present invention, rather than to limit the protection scope of the present invention.

In the drawings, structurally identical components are denoted by the same numerals, and structurally or functionally similar components are denoted by like numerals throughout the present application. In addition, for ease of understanding and description, sizes and thicknesses of components shown in the accompanying drawings are not to scale, and the present invention does not specifically limit the sizes and thicknesses of the components.

Embodiment

As shown in FIG. 1, the embodiment provides a display panel 100. The display panel 100 includes: a substrate 1, a first electrode 2, a first functional layer 3, a first light-emitting layer 4, a charge generation layer 5, a second functional layer 6, a second light-emitting layer 7, a third functional layer 8, and a second electrode 9.

A material of the substrate 1 is one or more than one of glass, polyimide, polycarbonate, polyethylene terephthalate, or polyethylene naphthalate, so the substrate 1 has better impact resistance to effectively protect the display panel 100.

The first electrode 2 is disposed on the substrate 1. A material of the first electrode 2 can be metal. In the present embodiment, a material of the first electrode 2 is silver (Ag). Therefore, the first electrode 2 not only has good electrical conductivity, but also can reflect light emitted by the first light-emitting layer 4 and the second light-emitting layer 7, thereby improving light extraction efficiency of the display panel 100.

The first functional layer 3 includes a hole injection layer (HIL for short) 31 and a first hole transport layer (HTL for short) 32.

The hole injection layer 31 is disposed on one side of the first electrode 2 away from the substrate 1. The hole injection layer 31 can be composed of an inorganic or organic material, including but not limited to, various elementary substances, compounds, and composites or mixtures thereof, which are, for example, small organic molecules, polymers, halogen compounds, oxygen compounds, nitrogen compounds, carbon compounds, and composites or mixtures thereof.

The first hole transport layer 32 is disposed on one side of the hole injection layer 31 away from the substrate 1. The first hole transport layer 32 can be composed of inorganic or organic materials, including but not limited to, various elementary substances, compounds, and composites or mixtures thereof, which are, for example, small organic molecules, polymers, halogen compounds, oxygen compounds, nitrogen compounds, carbon compounds, and composites or mixtures thereof. The first hole transport layer 32 controls transport of holes, thereby controlling combination of holes and electrons in the first light-emitting layer 4, thereby improving light-emission efficiency of the display panel 100.

The first light-emitting layer 4 is disposed on one side of the first hole transport layer 32 away from the substrate 1.

The charge generation layer 5 is disposed on one side of the first light-emitting layer 4 away from the substrate 1. A material of the charge generation layer 5 includes a mixture of an n-type organic material, a p-type organic material, and a polar solvent. The n-type organic material is a metal chelate compound. The metal chelate compound includes one or more than one of 8-hydroxyquinolate aluminum, a derivative of 8-hydroxyquinolate aluminum, 8-hydroxyquinolate lithium, or a derivative of 8-hydroxyquinolate lithium. The p-type organic material is a triarylamine-based derivative. The polar solvent includes an aromatic-alcohol-based derivative.

In the embodiment, the n-type organic material and the p-type organic material are mixed to form the charge generation layer 5, which can increase a contact area between the n-type organic material and the p-type organic material, thereby improving charge transfer efficiency, improving chances of separation of electrons and holes, and ultimately improving charge generation efficiency of the charge generation layer 5.

An energy level difference between a highest occupied molecular orbital (HOMO) energy level of the p-type organic material and a lowest unoccupied molecular orbital (LUMO) energy level of the n-type organic material is less than 2 eV.

The HOMO energy level of the p-type organic material ranges from 4.5 eV to 5.5 eV. The LUMO energy level of the n-type organic material ranges from 2 eV to 4 eV. In the present embodiment, the HOMO energy level of the p-type organic material is 4.5 eV. The LUMO energy level of the n-type organic material is 3 eV. The energy level difference between the HOMO energy level of the p-type organic material and the LUMO energy level of the n-type organic material is 1.5 eV.

A mass ratio of the n-type organic material to the p-type organic material is 1:0.1 to 1:9. In the present embodiment, the mass ratio of the n-type organic material to the p-type organic material is 1:0.5.

A thickness of the charge generation layer 5 ranges from 10 nm to 60 nm. In the present embodiment, a thickness of the charge generation layer 5 is 35 nm. Compared with a charge generation layer of a double-layer structure in conventional techniques, the thickness of the present application is reduced, which can improve the lightness and thinness of the display panel 100 and improve the customer experience.

The second functional layer 6 is disposed on one side of the charge generation layer 5 away from the substrate 1. In the present embodiment, the second functional layer 6 includes a second hole transport layer 61. The second hole transport layer 61 can consist of inorganic or organic materials, including but not limited to, various elementary substances, compounds, and composites or mixtures thereof, which are, for example, small organic molecules, polymers, halogen compounds, oxygen compounds, nitrogen compounds, carbon compounds, and composites or mixtures thereof. The second hole transport layer 61 controls transport of holes, thereby controlling combination of holes with electrons in the second light-emitting layer 7, thus improving the light emission efficiency of the display panel 100.

The second light-emitting layer 7 is disposed on one side of the second functional layer 6 away from the substrate 1.

The third functional layer 8 includes an electron transport layer (ETL for short) 81 and an electron injection layer (EIL for short) 82.

The electron transport layer 81 is disposed on one side of the second light-emitting layer 7 away from the substrate 1. The electron transport layer 81 can consist of inorganic or organic materials, including but not limited to, various elementary substances, compounds, and composites or mixtures thereof, which are, for example, small organic molecules, polymers, halogen compounds, oxygen compounds, nitrogen compounds, carbon compounds, and composites or mixtures thereof. The electron transport layer 81 controls transport of electrons, thereby controlling the combination of electrons and holes in the second light-emitting layer 7, thus improving the light-emission efficiency of the display panel 100.

The electron injection layer 82 is disposed on one side of the electron transport layer 81 away from the substrate 1.

The electron injection layer 82 can consist of inorganic or organic materials, including but not limited to, various elementary substances, compounds, and composites or mixtures thereof, which are, for example, small organic molecules, polymers, halogen compounds, oxygen compounds, nitrogen compounds, carbon compounds, and composites or mixtures thereof.

The second electrode 9 is disposed on one side of the electron injection layer 82 away from the substrate 1. Indium tin oxide (ITO for short), as a nano-indium tin metal oxide, has good electrical conductivity and light transmittance, so a material of the second electrode 9 is preferably ITO in the present embodiment.

In fact, a thin film transistor layer (not illustrated) is disposed between the substrate 1 and the first electrode 2. The thin film transistor layer includes: an active layer, a gate insulating layer, a gate electrode layer, an interlayer insulating layer, and a source-drain layer. The source-drain layer includes a source electrode and a drain electrode. The first electrode 2 is electrically connected to the drain electrode, and the source electrode and the drain electrode are electrically connected to the active layer.

As shown in FIG. 2, the present application further provides a manufacturing method of a display panel 100, including the following steps. Step S1: producing a first electrode 2 on a substrate 1. Step S2: printing a hole injection layer 31 on one side of the first electrode 2 away from the substrate 1 and printing a first hole transport layer 32 on one side of the hole injection layer 31 away from the substrate 1, wherein the hole injection layer 31 and the first hole transport layer 32 form a first functional layer 3. Step S3: printing a first light-emitting layer 4 on one side of the first functional layer 3 away from the substrate 1. Step S4: printing a mixture of an n-type organic material, a p-type organic material, and a polar solvent on one side of the first light-emitting layer 4 away from the substrate 1 to form a charge generation layer 5. Step S5: printing a second hole transport layer 61 on one side of the charge generation layer 5 away from the substrate 1 to form a second functional layer 6. Step S6: printing a second light-emitting layer 7 on one side of the second functional layer 6 away from the substrate 1. Step S7: printing an electron transport layer 81 on one side of the second light-emitting layer 7 away from the substrate 1 and printing an electron injection layer 82 on one side of the electron transport layer 81 away from the substrate 1, wherein the electron transport layer 81 and the electron injection layer 82 form a third functional layer 8. Step S8: printing a second electrode 9 on one side of the third functional layer 8 away from the substrate 1. By printing the mixture of the n-type organic material, the p-type organic material, and the polar solvent on one side of the first light-emitting layer 4 away from the substrate 1 to form the charge generation layer 5, the present application avoids the use of a fine metal mask (FMM) in an evaporation process and reduces production costs, and the present application is suitable for being used in large-size-screen G8.6 production lines.

The display panel and the manufacturing method of the display panel provided by the present application are described in detail above. Specific examples are used to illustrate the working principles and embodiments of the present application. The descriptions of the above embodiments are only used for ease of understanding the method and main ideas of the present application. According to the ideas of the present application, those skilled in the art can change or modify the specific embodiments and the range of application. In summary, the content of this specification should not be construed as a limitation to the present application.

What is claimed is:

1. A display panel, comprising:

a substrate;

a first electrode disposed on the substrate;

a charge generation layer disposed at one side of the first electrode away from the substrate; and a second electrode disposed at one side of the charge generation layer away from the substrate;

wherein a material of the charge generation layer comprises a mixture of an n-type organic material and a p-type organic material, and an energy level difference between a highest occupied molecular orbital (HOMO) energy level of the p-type organic material and a lowest unoccupied molecular orbital (LUMO) energy level of the n-type organic material is less than 2 eV.

2. The display panel according to claim 1, wherein the HOMO energy level of the p-type organic material ranges from 4.5 eV to 5.5 eV.

3. The display panel according to claim 1, wherein the LUMO energy level of the n-type organic material ranges from 2 eV to 4 eV.

4. The display panel according to claim 1, wherein a mass ratio of the n-type organic material to the p-type organic material is 1:0.1 to 1:9.

5. The display panel according to claim 1, wherein the n-type organic material is a metal chelate compound, the p-type organic material is a triarylamine-based derivative, and the polar solvent comprises an aromatic-alcohol-based derivative.

6. The display panel according to claim 5, wherein the metal chelate compound comprises: one or more than one of 8-hydroxyquinolate aluminum, a derivative of 8-hydroxyquinolate aluminum, 8-hydroxyquinolate lithium, or a derivative of 8-hydroxyquinolate lithium.

7. The display panel according to claim 1, wherein a thickness of the charge generation layer ranges from 10 nm to 60 nm.

8. The display panel according to claim 1, further comprising:

a first functional layer disposed between the first electrode and the charge generation layer;

a first light-emitting layer disposed between the first functional layer and the charge generation layer;

a second functional layer disposed between the charge generation layer and the second electrode;

a second light-emitting layer disposed between the second functional layer and the second electrode; and a third functional layer disposed between the second light-emitting layer and the second electrode.

\* \* \* \* \*